(12) United States Patent
Loschner et al.

(10) Patent No.: US 6,989,546 B2
(45) Date of Patent: Jan. 24, 2006

(54) PARTICLE MULTIBEAM LITHOGRAPHY

(75) Inventors: Hans Loschner, Vienna (AT); Gerhard Stengl, Wernberg (AT); Herbert Vonach, Klosterneuburg (AT); Elmar Platzgummer, Vienna (AT)

(73) Assignee: IMS-Innenmikrofabrikations Systeme GmbH, Vienna (AT)

( * ) Notice: Subject to any disclaimer, the term of this patent is extended or adjusted under 35 U.S.C. 154(b) by 0 days.

(21) Appl. No.: 09/375,627

(22) Filed: Aug. 17, 1999

(65) Prior Publication Data

US 2003/0209676 A1 Nov. 13, 2003

(30) Foreign Application Priority Data

Aug. 19, 1998 (AT) .............................................. 1415/98

(51) Int. Cl.
*H01J 37/08* (2006.01)

(52) U.S. Cl. .............................. 250/492.22; 250/492.2; 250/492.23

(58) Field of Classification Search ............ 250/492.22, 250/492.2, 492.23, 398
See application file for complete search history.

(56) References Cited

U.S. PATENT DOCUMENTS

| | | | |
|---|---|---|---|
| 4,209,702 A | | 6/1980 | Shirai et al. |
| 4,524,278 A | * | 6/1985 | Le Poole ..................... 250/398 |
| 4,967,088 A | | 10/1990 | Stengl et al. |
| 5,012,105 A | | 4/1991 | Ando et al. |
| 5,359,202 A | * | 10/1994 | Yasuda ..................... 250/492.2 |
| 5,369,282 A | | 11/1994 | Arai et al. |
| 5,637,951 A | * | 6/1997 | Parker ........................ 313/336 |
| 5,742,062 A | | 4/1998 | Stengl et al. |
| 5,841,145 A | * | 11/1998 | Satoh ..................... 250/492.22 |
| 5,933,211 A | * | 8/1999 | Nakasugi ..................... 355/18 |
| 5,945,677 A | | 8/1999 | Leung et al. |
| 5,977,548 A | * | 11/1999 | Oae ............................ 250/397 |
| 6,157,039 A | * | 12/2000 | Mankos ................... 250/492.2 |

FOREIGN PATENT DOCUMENTS

EP            0 087 196            8/1983

OTHER PUBLICATIONS

"Characteristics And Applications Of Multiple Beam Machines", Julius J. Muray, Microelectronic Engineering 9 (1989), pp. 305–309.

(Continued)

*Primary Examiner*—Nikita Wells
(74) *Attorney, Agent, or Firm*—Welsh & Katz, Ltd.; Thomas R. Vigil (57) ABSTRACT

In a particle multibeam lithography apparatus an illumination system (242) having a particle source (203) produces an illuminating beam (205) of electrically charged particles, and a multibeam optical system (208) positioned after the illumination system (242) and comprising at least one aperture plate having an array of a plurality of apertures to form a plurality of sub-beams focuses the sub-beams onto the surface of a substrate (220), wherein for each sub-beam (207) a deflection unit (210) is positioned within the multibeam optical system and adapted to correct individual imaging aberrations of the respective sub-beam with respect to the desired target position and/or position the sub-beam during a writing process an the substrate surface. Preferably, for each sub-beam the respective aperture of the first aperture plate defines the size and shape of the sub-beam cross-section and the multibeam optical system produces a demagnified image of the aperture on the substrate surface, with a demagnification of at least 20:1.

29 Claims, 6 Drawing Sheets

OTHER PUBLICATIONS

Electron–beam microcolumns for lithography and related applications:, T.H.P. Chang, et al., J.Vac.Sci.Technol.B 14(6), (Nov./Dec. 1996), pp 3774–3781.

"An Approach To Multiple E–Beam System", Nobuo Shimazu, et al., Proceedings of the 'International Workshop On High Throughput Chaged Particle Lithography', Hawaii (Aug. 11–15, 1997).

"A New Focused Ion Beam System For Maskless Direct–write Lithography", Q. Ji, et al., Proceedings of the 43rd International Conference on Electron, Ion and Photon Beam Technology and Nanofabrication, (EIPBN 1999), Marco Island, Florida (Jun. 1–4, 1999).

"Distributed, multiple variable shaped electron beam column for high throughput maskless lithography", T.R. Groves, et al., J. Bac.Sci.Technol.B 16(6), (Nov./Dec. 1998) pp 3168–3173.

"Illumination and source requirements for a distributed–axis electron beam lithography system", D.S. Pickard, et al., Proceedings of the EIPBN 1999.

"High throughput electron lithography with the multiple aperture pixel by pixel enhancement of resolution concept", P. Kruit, J.Vac.Sci.Technol.B 16(6) (Nov./Dec. 1998), pp 3177–3180.

"Capability of Ion Beam Projection Optics for Microfabrication", Y. Madokoro, et al., Microelectronic Engineering 46 (1999), pp 493–496.

"Vakuumbeschichtung 1", Hartmut Frey, VDI–Verlag, Dusseldorf, Germany (1995), Section 1.12.3, pp 154–162.

"Technology of ion beam sources used in sputtering", Harold R. Kaufman, J.Vac.Sci.Technol. 15(2), (Mar./Apr. 1978), pp 272–276.

"Micromachined single–crystal silicon electron lenses", Wolfgang Hofman, et al., J.Vac.Sci.Technol.B 15(6), (Nov./Dec. 1997, pp 2713–2717.

"The electrostatic moving objective lens and optimized deflection systems for microcolumns", M.G.R. Thomson, J.Vac.Sci.Technol. B 14(6), (Nov./Dec. 1996), pp 3802–3807.

"Electrostatus Lenses", E. Harting, et al., Elsevier Scientific Publishing Company, Amsterdam, The Netherlands, 1976, pp 175–176.

"Focusing of Charged Particles", Albert Septier, Academic Press, New York, 1967, vol. II, Chapter 3.1.

"Tabellen zur angbewandten Physik", Manfred Von Ardenne, Veb Deutscher Verlag der Wissenschaften, Berlin, Germany, 1975, vol. 1, pp 9–13.

* cited by examiner

PARTICLE MULTIBEAM LITHOGRAPHY

FIELD OF THE INVENTION AND DESCRIPTION OF PRIOR ART

The invention relates to multibeam lithography by means of electrically charged particles.

More exactly, the invention refers to an apparatus for multibeam lithography by means of electrically charged particles, comprising an illumination system having a particle source, the illumination system producing an illuminating beam of said electrically charged particles, and a multibeam optical system positioned after the illumination system as seen in the direction of the beam, said multibeam optical system comprising at least one aperture plate having an array of a plurality of apertures to form a plurality of sub-beams, wherein the multibeam optical system focuses the sub-beams onto the surface of a substrate.

Likewise, the invention relates to a method for multibeam lithography by means of electrically charged particles, wherein a particle beam is produced by a particle source, transferred into an illuminating beam and formed into a plurality of sub-beams, the sub-beams being formed by means of at least one aperture plate having an array of a corresponding plurality of apertures and the sub-beams are focused onto the surface of a substrate.

A multibeam lithography system was proposed, for instance, by J. J. Muray in Microelectronics Engineering 9 (1989) pp. 305–309. There, all electron or ion beam is divided into a plurality of sub-beams by means of a screen lens which comprises a corresponding plurality of apertures whose diameters are small compared with their mutual distances, arranged in a regular array; the sub-beams are focused onto the wafer surface by virtue of the so-called aperture lens or fly's eyes effect caused by the screen lens apertures.

Using a plurality of particle beams serves to raise the throughput while, at the same time, increasing the substrate area being structured, which usually is the area of a wafer, namely by simultaneously writing structures which are equal in different regions of the substrate/wafer. In particular, this method can be used for simultaneous writing of wafer dies which are equal one to another and into which the wafer is divided according to a regular array. Moreover, the reduced particle density results in a distinctly lowered influence of the Coulomb interaction within each sub-beam and thus in a smaller contribution to imaging aberrations.

In J. J. Muray's multibeam device design, however, the aperture screen is positioned in proximity to the wafer, which gives rise to problems such as contamination of the screen apertures by substances produced in the course of the processing of the substrate. Moreover, an individual adjustment of the sub-beams cannot be realized due to the restricted space situation. In order to confine the beam at the substrate surface into a small spot suitable for semiconductor processing the apertures have to be very small. For instance, a typical value of a desired beam diameter at the substrate is, e g, 50 nm and since with a single aperture lens a demagnification factor of not greater than 10:1 can be reached under realistic conditions, the aperture diameter necessarily is smaller than 0.5 $\mu$m. Consequently, the production of the screen lens, in particular with respect to shape and positions of the apertures, requires a very high precision. For these reasons, this design was not considered suitable for commercial lithography purposes.

In the article "An Approach to Multiple E-Beam System" of the conference proceedings of the 'International Workshop on High Throughput Charged Particle Lithography', Hawaii, Aug. 11–15, 1997, N. Shimazu et al. present an electro-optical system with a single electron gun, wherein after the cross-over, the beam of the electron gun is split into an array of sub-beams by means of a lens matrix and the cross-over is imaged demagnified onto a wafer by subsequent arrangements of various apertures and objective lenses. Rather than by virtue of aperture lens effects, however, for the focusing of the beam objective lenses are provided having comparatively high numerical aperture. The adjustment of the imaging properties and correction of imaging aberrations via the individual objective lenses, though not treated explicitly in the article of N. Shimazu et al., is difficult because of the very restricted conditions of space in the target region. Moreover, often the close position of the objective lenses to the substrate will bring about problems arising from the byproducts of the substrate treatment, for instance with the well-known outgassing of resist layers.

In an article of J. Vac. Sci Technol. B 14 (1996) pp. 3774–3781, T. H. P. Chang et al. demonstrate that it is possible to realize a 1 keV electron beam column as a miniature scanning electron microscope having a lateral dimension of 20 mm. By arranging a plurality of miniature columns of this kind side-by-side it is possible to realize a multibeam lithography system. The tips of the field emission electron sources are imaged 1:1 onto the substrate, thus an appropriate shaping of the individual beams is a necessary requirement with this system. It should be noted, however, that whenever a set of sources is required, in particular one source for each of the beams to be used, this complicates the implementation of a multibeam setup and, moreover, it is difficult to maintain a sufficiently homogeneous set of beams. Moreover, since each individual miniature column comprises a complete equipment of an electron microscope, the implementation of a multibeam lithography system requires great expenditures during production and maintenance, and in particular during adjustment of the miniature columns. Q. Ji et al., in the article "A New Focused Ion Bean System for Maskless Direct-write Lithography" of the conference proceedings of the '43$^{rd}$ International Conference on Electron, Ion and Photon Beam Technology and Nanofabrication' (EIPBN '99), Marco Island, Fla., Jun. 1–4, 1999 (to be published in J. Vac. Sci. Technol. B, November/December 1999), propose a direct-write focused ion beam system wherein a multicusp plasma source generates an ion beam of high spectral brightness and low ion energy spread of below 1 eV, and an electrostatic accelerator column focuses the beam to a 500 nm focal spot, A similar ion-beam lithography system comprising a focused ion-beam column having lateral dimensions of a few cm is discussed by Y. Lee et al. in Microel. Engin. 45 (1999) pp. 469–472. In these systems the shape of each sub-beam is defined by an aperture situated in the extraction system of the ion source. Thus, a majority of the ions produced by the source are shut off by the aperture. More important, the defining aperture has to be positioned within the extraction system very precisely since already a minute geometrical deviation will cause a substantial aberration of the image generated on the substrate.

The concept of a direct-write variable-beam system with multiple columns is described by T. R. Groves and R. A Kendall in J. Vac. Sci. Technol. B 16 (1998) pp. 3168–3173, wherein focusing of the beamlets is performed magnetically while the deflection of the beamlets used for writing on the substrate is done by electric fields. A realization of this concept is given by D, S. Pickard et at in the article "Illumination and source requirements for a distributed-axis electron beam lithography system" of the conference proceedings of the EIPBN '99. The system proposed there comprises thin photocathodes illuminated by an array of semiconductor lasers, wherein the photoelectrons from each laser-illuminated spot are focused onto an anode plate having an array of apertures of the required final beam shape, and a 1:1 magnification image of each anode aperture is focused onto the substrate. The unity magnification is a consequence of the fact that an axial magnetic field is used for focusing, whereas the deflection of the beam is done by means of electric fields. The magnetic field used for focusing has to be very homogeneous; the provision of individual adjustment of the magnetic focusing of the individual beams would be very complex. In order to provide for a way of individual adjustment of the beams, arid also in order to compensate for the small depth of focus of the magnetic focusing system, fine correction elements using electric fields are required, and thus the total magneto-optical imaging system becomes intricate and difficult to realize. Due to the small size of the beam radius, namely about 1 $\mu$m (or even less), this setup requires a considerable current density, which cannot be achieved reliably in a demountable vacuum setup such as a semiconductor production device. Also, due to the use of photocathodes the Groves and Kendall/Pickard et al. system is restricted to electron beams. Moreover, it is a well-known disadvantage of photocathodes that they are very susceptible to contaminations and require a UH vacuum.

SUMMARY OF THE INVENTION

It is an object of the present invention to provide a multibeam lithography system providing for sub-beams of high brightness but being substantially equivalent to each other across the total array of sub-beams. The positions of the sub-beam images on the substrate surface shall be adjusted independently to minimize aberrations while the basic configuration of the multibeam optical system shall be affected as little as possible. Moreover, it shall be possible to keep the substrate in a suitable distance to the particle optical system so that the wafer plane is sufficiently 'decoupled' from the optics.

These aims are met by an apparatus for multibeam lithography of the kind as stated in the beginning in which for each sub-beam a deflection unit is provided, said deflection unit being positioned within the multibeam optical system and adapted to correct individual imaging aberrations of the respective sub-beam with respect to the desired target position and/or position the sub-beam during a writing process all the substrate surface.

Likewise, the aim is met by a lithographic method of the kind as stated in the beginning wherein the beam position of each sub-beam is controlled by means of a deflection unit, for correcting individual imaging aberrations of the respective sub-beam with respect to the desired target position and/or positioning the sub-beam during a writing process an the substrate surface.

According to the invention, it is possible to implement the basic focusing properties independent of the adjustment of the individual image of the sub-beams, Thus, the invention provides a simple solution for the treatment of the imaging aberrations and the positioning of the individual sub-beams independently of each other. Due to the very accurate positioning of the beams on the substrate to be structured, the use of a deflection unit allows a relaxed requirement on the accuracy for the mechanical positioning of the wafer stage. This reduces the production expenditures and simplifies adjustment of the components of the lithography setup as well as controlling during operation The apertures defining the sub-beams are separated from the extraction system. This appreciable circumstance results in an augmented tolerance with respect to deviations in the extraction geometry as well as in the position of the apertures with respect to the sub-beam axes.

The deflection unit is preferably placed at the end of the optical system provided for the respective beam, i.e., after or directly before the last lens of the optical column. Thus, an advantageous embodiment of the invention comprises a particle source and a collimator optical system for producing a particle beam which is substantially homogeneous across its cross-section and a multibeam optical system positioned after the collimator optical system as seen in the direction of the beam, said multibeam optical system forming the beam into a plurality of sub-beams and focusing the sub-beams onto the surface of a substrate, wherein the multibeam optical system comprises at least one aperture plate having an array of a corresponding plurality of apertures to form said sub-beams, wherein for each sub-beam and positioned after the multibeam optical system, a deflection unit is provided, said deflection unit being positioned after the multibeam optical system and adapted to correcting individual imaging aberrations of the respective sub-beam with respect to the desired target position and/or positioning the sub-beam during a writing process an the substrate surface.

Preferably, the electrically charged particles are ions, such as protons or helium ions; but also heavier ions can be used depending on the desired application Due to the extremely low wavelength of ions, ion-optical systems offer various advantageous features with respect to the imaging quality, in particular a very low numerical aperture. As a consequence, the distance between the optical system and the substrate can be enlarged substantially so as to allow plenty of space for, e.g., the deflection unit, as well as enhance the decoupling of the wafer plane from the optics system.

In a preferred embodiment of the invention, for each sub-beam the respective aperture of the first aperture plate defines the size and shape of the sub-beam cross-section and the multibeam optical system produces an image of said aperture on the substrate surface Advantageously, the multibeam optical system produces a demagnified image of said aperture on the substrate surface, the demagnification factor being at least 20:1. The demagnification factor may suitably be at least 400:1. As opposed to direct focusing of a particle beam emitted from a source, imaging an aperture has the advantage that the sub-beam spot size and shape at the substrate is completely defined by size and shape of the aperture and by the optics, and basically independent of variations in the properties of the virtual source. Using a demagnification of the aperture facilitates producing a light intensity of the sub-beams since the intensity is proportional to the area of the aperture. Moreover, the requirements on precision of fabrication are relaxed since, e.g., a deviation of the aperture position or size is likewise imaged onto the substrate reduced by the demagnification factor.

It is in particular the combination of using a common particle source for producing the array of sub-beams and imaging the apertures forming the sub-beams by means of a demagnetizing optical system which is realized as a microcolumn array, which offers an especially advantageous realization of the invention. By virtue of this combination, the sub-beams are substantially equivalent to each other, though can be adjusted individually with respect to their optical characteristics such as width and aberrations. Using one common source eliminates the risk with multiple sources that the sub-beams might be non-equivalent due to differences/fluctuations between the multiple sources, Moreover; it ensures generation of well-defined, high-intensity image spots on the substrate surface mid at the seine time allows a large distance between the optical system and the substrate. Thus, the deflection units of the individual sub-beams can be used primarily for control of the shaping and positioning of the sub-beams on tile substrate.

In order to simplify realization of the optical system and avoid the cross-talk effects between magnetic lenses, the multibeam optical system can be realized as an electrostatic lens column array.

In a further advantageous embodiment, for each sub-beam an electrostatic lens arrangement is provided as a means to adjust the beam diameter at the substrate surface, This facilitates the adjustment of the sub-beams substantially so as to render them equivalent to each other, Suitably, for instance to reduce the total space required for the optical column, this electrostatic lens arrangement is integrated within one respective lens of the multibeam optical system.

Furthermore it is favorable if the deflection units are electrostatic multiple electrode systems which allow a simple implementation of expensive correction of aberrations slid repositioning of the beam. The production of the electrostatic multiple electrode systems is possible employing microfabrication methods, e.g. using semiconductor technology.

Moreover, the deflection units of the sub-beams may be organized in groups, so that the controlling of the beam positioning of the sub-beams may be performed synchronously for all groups. This writing method reduces the supply and controlling elements for the deflection units, and at the same time reduces the risk of cross-talk effects.

Another advantageous embodiment has a reference plate for alignment of the particle optical system, facilitating adjustment of the optics and allowing adjustment even without a substrate being present, Suitably, the lithography device comprises an optical alignment system to adjust the position of the substrate with respect to the reference plate.

Moreover, it simplifies production and operation of the lithographic device if several aperture plates are provided which are penetrated by the sub-beams, said aperture plates having openings forming aperture lenses having a focusing effect on the sub-beams.

In order to further reduce the place needed for the optical column components, the deflection unit may be integrated into one or more of the electrodes forming the electrostatic lens arrangement, Preferably, the electrodes of the deflection unit are realized as sectors of at least one annular region around the apertures, the sectors being electrically insulated from each other.

In another advantageous variant of the invention, the deflection unit is a travelling wave deflector means, comprising poles segmented in axial direction forming segments, the segments being connected in the axial direction by inductive and capacitive elements to transfer the electric field within the deflection unit from one segment to the next with a predetermined speed.

Preferably, each sub-beam is adjusted with respect to its beam diameter at the substrate surface by means of an electrostatic lens arrangement.

BRIEF DESCRIPTION OF THE DRAWING

The invention is illustrated with respect to a preferred embodiment as shown in the figures. The figures show.

DETAILED DESCRIPTION OF THE INVENTION

Figure 1:
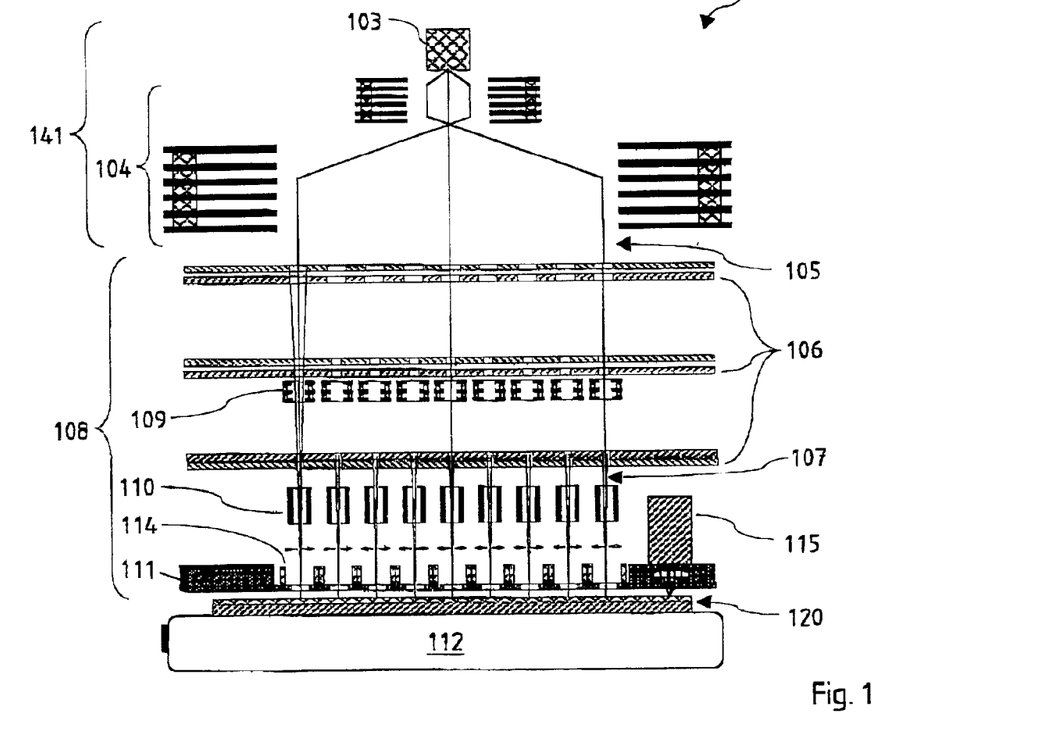
FIG. 1 a first multibeam lithography system according to the invention in a longitudinal section.

As a first preferred embodiment of the invention, an exemplary ion multibeam lithography system 101 is shown in the schematic longitudinal section of FIG. 1. This lithography system is arranged for writing of structures onto a resist-covered wafer substrate 120. The first part of the system, the illumination system 141, comprises an ion source 103 and a collimator optics system 104 and serves to produce a broad ion beam 105. The total width of the illuminating beam 105 produced by the illumination system 121 is at least a wafer diameter, e.g., 300 mm. A collimator optics system for producing a particle beam of this kind is disclosed by G. Stengl et al. in the U.S. Pat. No. 5,742,062. The beam 105 is substantially homogeneous over its width so as to have a particle flow sufficiently uniform within the allowed tolerances for all individual beams which are produced from the illuminating beam.

The illuminating beam 105 emerging from the illuminating system 141, is telecentric and it illuminates the first plate of an arrangement of electrostatic aperture plates 106. The aperture openings of the first of the aperture plates 106 form the beam 105 into a plurality of sub-beams 107. The aperture plates 106 and additional imaging elements associated with the individual sub-beams 107 represent a multibeam optical system 108. The openings of the aperture plates are shaped such that each of the sub-beams 107 is successively focused into a concentrated intensity on the substrate. The optical system 108 is realized as an array of microcolumns and ensures the precise imaging or concentration of the sub-beams 107 on the substrate, An example of the operation of the microcolumns of the optical system with respect to its optical properties is discussed in detail below with reference to FIG. 4. For the sake of clearness, the sub-beams 107 are shown only partially in FIGS. 1, 3 and 5.

In order to adjust the focusing properties of the sub-beams individually, in particular with respect to the beam diameter and position on the substrate surface, an arrangement of electrostatic lenses 109 is provided, for instance between the aperture plates. For each sub-beam a deflection unit 110 is provided, which in the embodiment shown is positioned between the last aperture plate and the substrate and is realized as an electrostatic multiple. Furthermore, a reference plate 111 is positioned above the substrate. By means of the electrostatic multipoles 110 it is possible to adjust each sub-beam 107 in principle independently from the other sub-beams on a specific spot on the wafer substrate 120 Moreover, the multipoles 110 offer a means of the compensation for imaging aberrations which are not corrected by other compensation elements such as the electrostatic lens elements 109 The electrostatic multipoles can be realized, for instance, as multiple electrode arrangements produced by microfabrication methods which, besides, is a preferred production method of the electrostatic lenses 109 as well Microfabrication methods are well-known in the semiconductor technology and allow the generation of structures of minute dimensions in the range of a few millimeters and less; thus they are especially suitable methods for the production of the electrode arrangements used with the invention. For instance, the article of W. Hofmann and N. C. MacDonald, in J. Vac. Sci. Technol. B 15 (1997) pp. 2713–2717, gives an account of recent progress in the field of microfabrication of sub-mm structures.

If ions are used, this offers various advantages as compared to electrons. Since the wavelength of ions such as helium ions is very small—at an energy of 100 keV the wavelength of electrons is approximately 4 pm, that of Helium ions approximately 0.05 pm—an ion optical system can operate at a numerical aperture which is smaller than that of a corresponding electron optics by two order of magnitudes. Therefore, it is possible to move the wafer plane off the optics by an additional offset corresponding to the reduction of the numerical aperture, which in turn reduces possible reverse effects on the optics from the wafer, for instance by substances outgassing from a resist cover. Whereas with electrons of high energy—that is, in the region above about 10 keV—the so-called proximity effect becomes apparent as a serious problem due to scattering in the resist material and backscattering in the substrate and with electrons of low energy crosstalk problems often arise, for ions these problems are encountered to a distinctly lower degree because of their comparatively large masses. Moreover, the sensitivity of resist materials to ions is higher, typically by a factor of 20.

Figure 3:
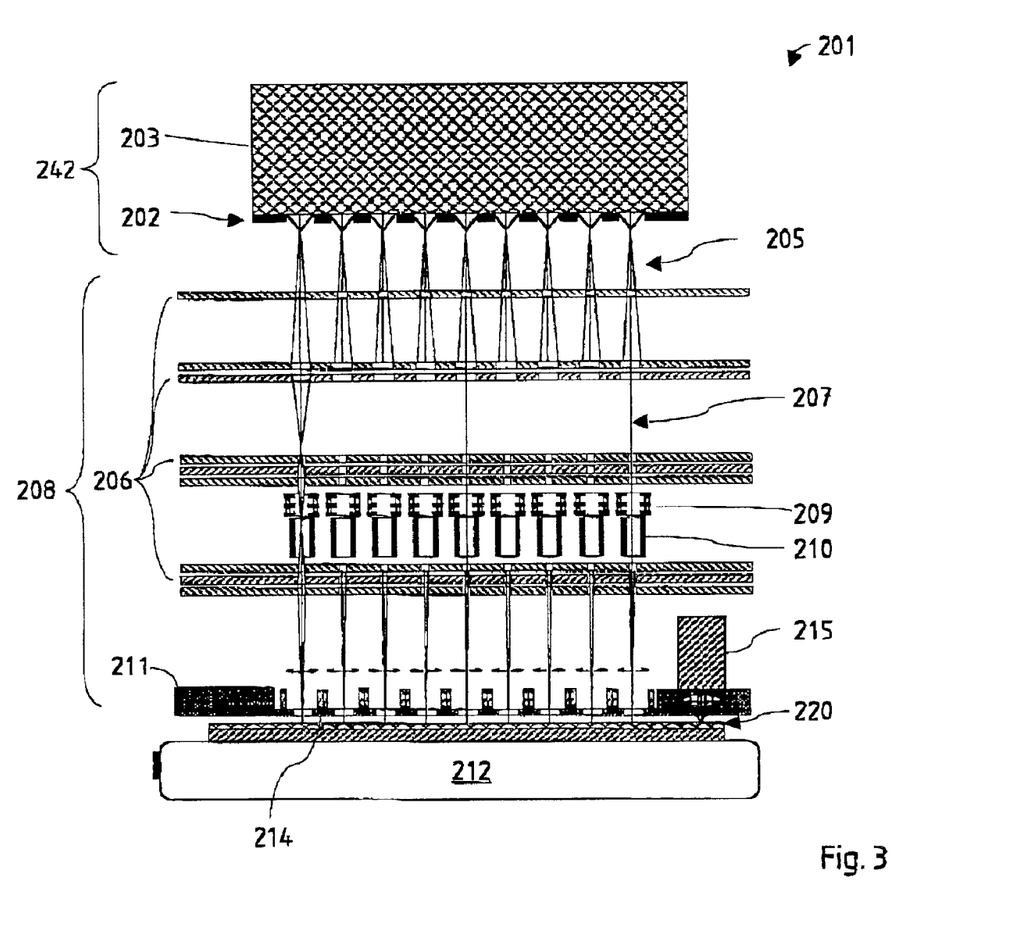
FIG. 3 a second multibeam lithography system, with an illumination system different from FIG. 1.
Figure 7:
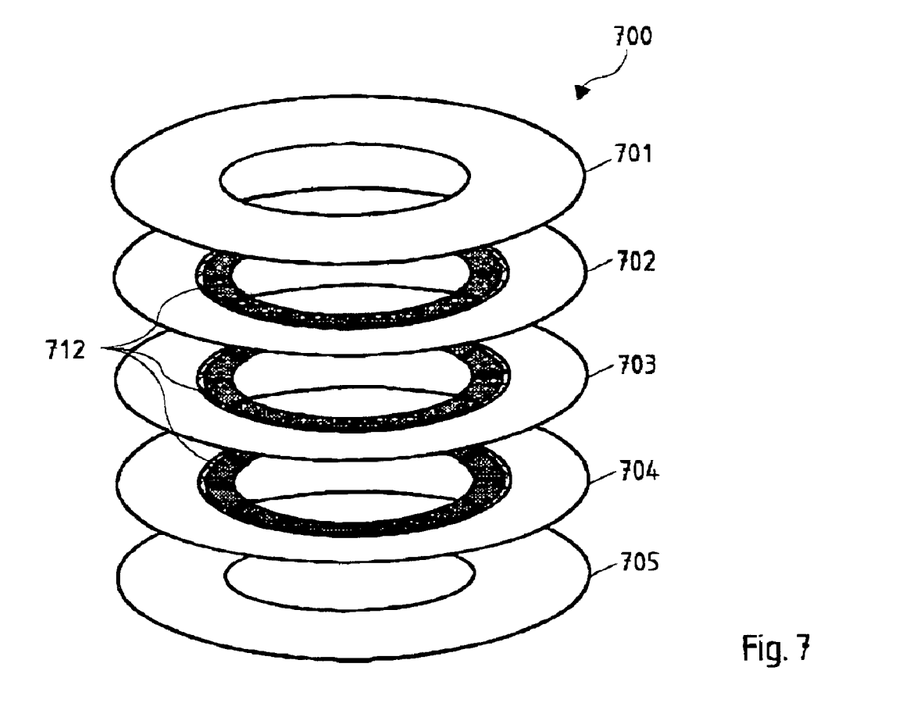
FIG. 7 a sectored electrode sealing both as electrostatic lens and deflection unit.

Each deflection unit can be realized either as a separate element situated before or after the objective lens, as indicated in FIGS. 1 and 3, or as sectored electrodes integrated in the lens fields of the optical system 108. The use of so-called "in lens" deflection elements suitable for the invention is described in detail, for instance, by M. G. R Thomson, in J. Vac. Sci. Technol. B 14 (1996) pp. 3802–3807. In order to achieve a considerable increase of the field size, Thomson suggests the microcolumn to comprise segmented in-lens deflector electrodes and additionally segmented electrodes (octopoles or dodecapoles) suppressing off axis aberrations such as coma, field curvature and third-order astigmatism. An example for a segmented multi-electrode unit 700 suitable for both tasks, a deflection of the beam in the lens field and a correction of third order off axis aberration effects is shown FIG. 7. This multi-electrode unit 700 is used as the last lens of the optical column. The optical lens is combined with multipoles in a configuration comprising five plates 701–705, wherein in each of the middle three electrodes 702,703,704 the annular region around the aperture is sectored electrically insulated from each other. For the sake of better visibility in FIG. 7, the distance between the plates 701–705 is exaggerated. The multipoles are realized as dodecapoles 712; the electric feeds of the individual sector elements are not shown in FIG. 7. The advantage of such a dodecapole electrode 712 is twofold: Firstly, by choosing dipole-like potentials of the electrodes a very homogeneous electrostatic field can be produced for deflection purposes with an arbitrary radial direction. This means that one single dodecapole electrode were already sufficient for the purpose of a deflection unit, reducing space requirements in the column and at the same time improving deflection aberrations compared with regular X-Y deflection plates. Secondly, the same dodecapole elements can be used as multiple lens in order to eliminate off axis aberrations, and consequently enlarge the accessible field area.

Figure 8:
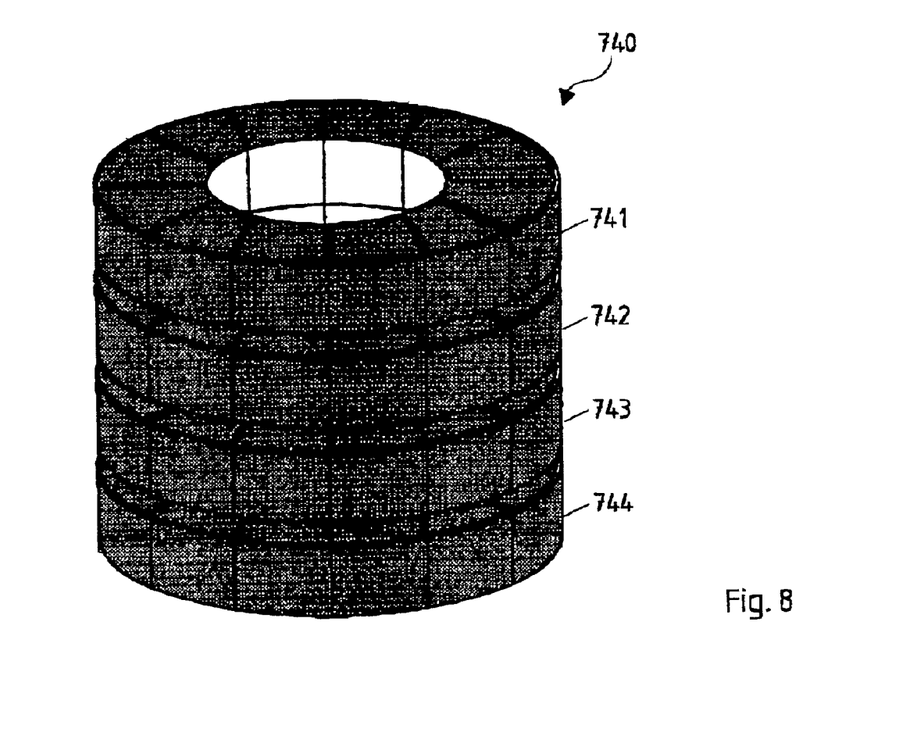
FIG. 8 a travelling-wave deflection unit.

If the pixel rate of the deflector and consequently the achievable throughput in lithography is limited by the time of flight of the ions through the deflector, a favorable embodiment of the invention will comprise a so called "travelling wave system", in which the deflecting field propagates through the deflector with the same speed as the particle as, for instance, described by M. v. Ardenne, in "Tabellen zur Angewandten Physik", Vol. 1, Deutscher Verlag der Wissenschaften, Berlin (Germany) 1975, pp. 9–13. This technology has become a standard technology in high frequency electronics, especially in high resolution oscillographs, and can be realized, for example, by subdividing extended deflection plates into a sequence of identical but comparably short chain segments along the optical axis The segments are electrically connected with neighboring segments by appropriate inductive and capacitive elements, determining the travelling speed of an electromagnetic wave. The implementation of a travelling wave deflector system swill increase the writing speed in the presence of heavy ions or low ion energies, but is not essential for the particular design of the micro column under consideration. FIG. 8 shows an example of a travelling wave deflection unit 740, wherein the electrostatic multiple is segmented into four segments 741–744.

In order to simplify the supply and control of the individual deflection units 110, the sub-beam writing deflection is synchronized. In one possible case, all sub-beams perform the identical write operations. If for some of the sub-beams these writing operations are not desired, these sub-beams are selectively shut off, e.g. by blanking out. In another scenario, the sub-beams 107 are divided into groups, these groups comprising, e.g., every second or sixth of the sub-beams, and the writing deflections of the sub-beams are performed synchronously within each group.

The area within which one sub-beam can be adjusted is small with respect to the area on the substrate that is allotted to the sub-beam; typical values are, e.g., 10×10 $\mu$m or 100×100 $\mu$m. Therefore, in order to cover the whole area to be written, it is necessary to combine the sub-beam deflection with a co-operating movement of the wafer stage 112. Since the deflection unit 110 can perform the positioning of the partial beam 107 on the wafer 120 with high accuracy, for instance by means of the methods described below, the requirements on the accuracy of the positioning of the wafer done by the wafer stage 112 are distinctly lower, in particular, the distance of the wafer stage positioning can be done in steps corresponding to the deflection width (e.g., 10 $\mu$m or 100 $\mu$m). On the other hand, the wafer stage needs only allow a positioning of the wafer along a maximum total displacement of the distance of two sub-beams 107, if necessary with an additional margin, for instance, 10 mm in the X and Y directions in the case that the individual sub-beams are spaced apart by 10 mm.

The alignment of the wafer is, for instance, done optically by means of one or more alignment system(s) 115 which are fixed to a reference plate 111. Alignment systems are already used in standard configurations of the optical lithography; an alignment system suitable for the invention is disclosed, e.g., in the U.S. Pat. No. 4,967,089 of G. Stengl et al. (=EP 0 294 363). In order to ensure a high throughput and keep the tracking area of the wafer stage low, several—at least two, preferably four—optical wafer alignment systems 115 operating in parallel are provided, by means of which it is possible to measure the quantities X, Y, rotation, scale and X-Y scale for the wafer exposed as a whole. Thus one aperture plate system is sufficient to meet a plurality of tasks in the lithographic setup.

Figure 2:
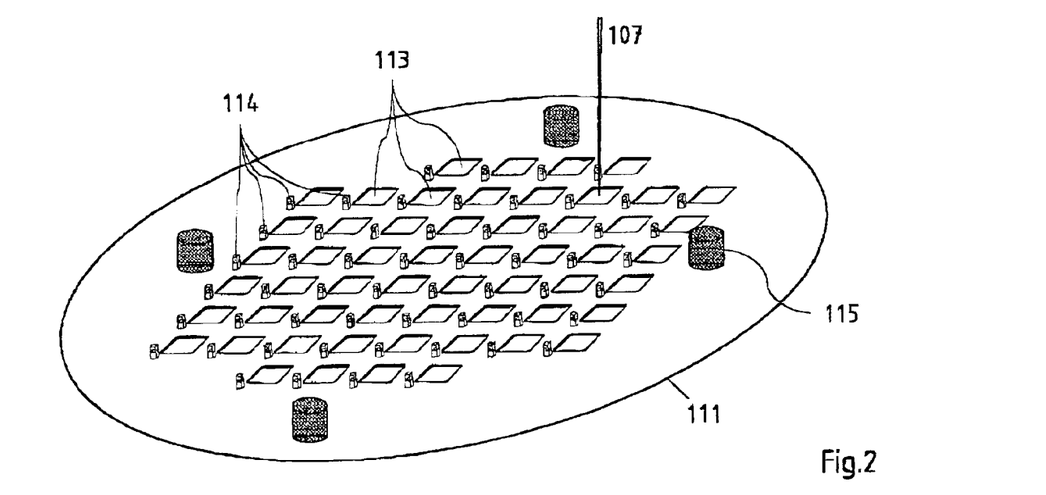
FIG. 2 a perspective view of a reference plate for the lithography system of FIG. 1.

Referring to FIG. 2, the reference plate 111 is, for instance, of a hybrid type and composed of a zerodure plate which comprises a window of e.g. a square shape of appropriate size for each sub-beam and to which silicon wafer parts with registering structures 113 are bonded. By means of the electrostatic multiple, each ion sub-beam can be directed to the respective registering mark 113 and scanned along it. The secondary electrons thus produced are registered by means of a secondary electron detector 114 which is associated with the registering mark on the reference plate 111. Thus, calibration and positioning of the individual ion beams 107 is possible at any time. Only one of the sub-beams 107 is depicted in FIG. 2 for the sake of enhanced clearness. Each detector 114 is provided for detecting the secondary electrons coming from one registering mark 113 or a specific group of registering marks. For each sub-beam 107 a window is provided in the reference plate, each having two registering marks which correspond to the X and Y directions, respectively. Moreover, the registering marks may be used during blanking, in that the beam is directed on a registering mark.

Besides the multibeam optics as described above referring to FIG. 1, where a multiple aperture plate is illuminated by a single particle source in order to subdivide a broad homogeneous particle beam, the use of a multi-source array represents a favorable alternative. A lithography system 201 comprising a multi-source array of this kind is shown in FIG. 3 illustrating a second preferred embodiment of the invention.

The illumination system 242 of the lithography system 201 comprises a source 203 producing a wide array of multiple ion beams and an extraction array 202. The source extraction system 202 produces an illuminating beam 205 realized as ail ion beam array comprising a plurality of ion sub-beams, where each sub-beam of the beam array corresponds to one of the apertures of the first aperture plate 106. Like the broad beam 105 of the system of FIG. 1, the total width of the beam array 205 is at least a wafer diameter, e.g., 300 mm.

Sources for a homogeneous broad ion beam are shown from the state of the art. For example, a broad ion beam source is described in "Vakuumbeschichtung", ed. H. Frey, VDI-Verlag, Düsseldorf (Germany) 1995, section 1.12.3, pp. 154–162, in particular FIG. 1-121 on p. 159 of said section. This so-called Kaufmann source comprises two parallel metal plates (called screen grid and acceleration grid, respectively) which are positioned at a small distance to each other and are provided with a multitude of holes, through which ion beams are generated, thus serving as extraction electrodes. H. R. Kaufmann, in J. Vac. Sci. Technol. 15 (1978) pp. 272–276, discusses a multipoles ion source which is designed to produce a very uniform ion beam. This source setup offers the advantage of very low magnetic field strengths except near the anode(s) and is well suited to larger sizes, such as a 30 cm source. As demonstrated by H. R. Kaufmann, an ion beam array consisting of a set of single, spatially separated beamlets can be extracted from an ion plasma using two or more extraction grid plates. Choosing a suitable arrangement of aperture plates, each beamlet can be passed through an extraction system (FIG. 5) analogous to that used previously for the single source illumination optics (FIG. 1). Thus each beam is characterized by a very small virtual source size and a high beam brightness. The extracted set of independent sub-beams can then be regarded as multi-beam source, composed by an array of virtual point-like particle sources.

The beams of the illuminating beam 205 are substantially equivalent so as to have a particle flow sufficiently uniform within the allowed tolerances for all individual beams of the beam array. The illuminating beam 205 emerging from the multi-source and extraction system 242, seen as a total, is telecentric and it illuminates the first of an arrangement of electrostatic aperture plates 206. The remaining details of the lithography system 201, i.e., components 206–215,220 of this embodiment correspond to those of the lithography system shown in FIG. 1 having reference numbers 106–115, 120, respectively.

The advantage of the described multibeam extraction over the illumination of a multiple aperture plate is its favorable scaling behavior with respect to the number of sub-beams, equivalent with an increased potential throughput achievable in direct write lithography. In comparison with existing multi-source approaches such as STM-aligned field emitter tips (cf. Chang et al. above), the proposed multi-source implies a considerable simplification in source manufacturing and handling, and, when ions are used as favored here, an enormous increase in brightness of the ion beam radiation.

In the lithography devices 101,201 shown in FIGS. 1 and 3, each exposure of the wafer 120,220 is done after an optical alignment performed by scanning the ion beams operating parallel within deflection regions which are, as already mentioned, stitched together by displacement of the wafer. For each sub-beam, there is an associated image area on the wafer, and the sub-beams are arranged in a regular array corresponding to the—usually rectangular—partitioning of the wafer into die chips. For example, each image area corresponds to a chip field of the wafer, which conforms to a 1:1 relationship. Alternatively, in a 1:n correspondence every nth chip of the wafer is written simultaneously, and the writing process is repeated a corresponding number (n−1) of times for the remaining chips after suitable repositioning. Conversely, it is also possible, in particular with large chip fields, to have several beams write in a single chip field; for instance, assuming a clip field size of 40×60 mm and a mutual sub-beam distance of 20 mm, one chip could be written using 6 partial beams at once, In the latter example, there are 6 groups of sub-beams, corresponding to the six sub-beams of each chip, and the set of beams can be used to simultaneously produce different structures within one writing step.

Figure 4:
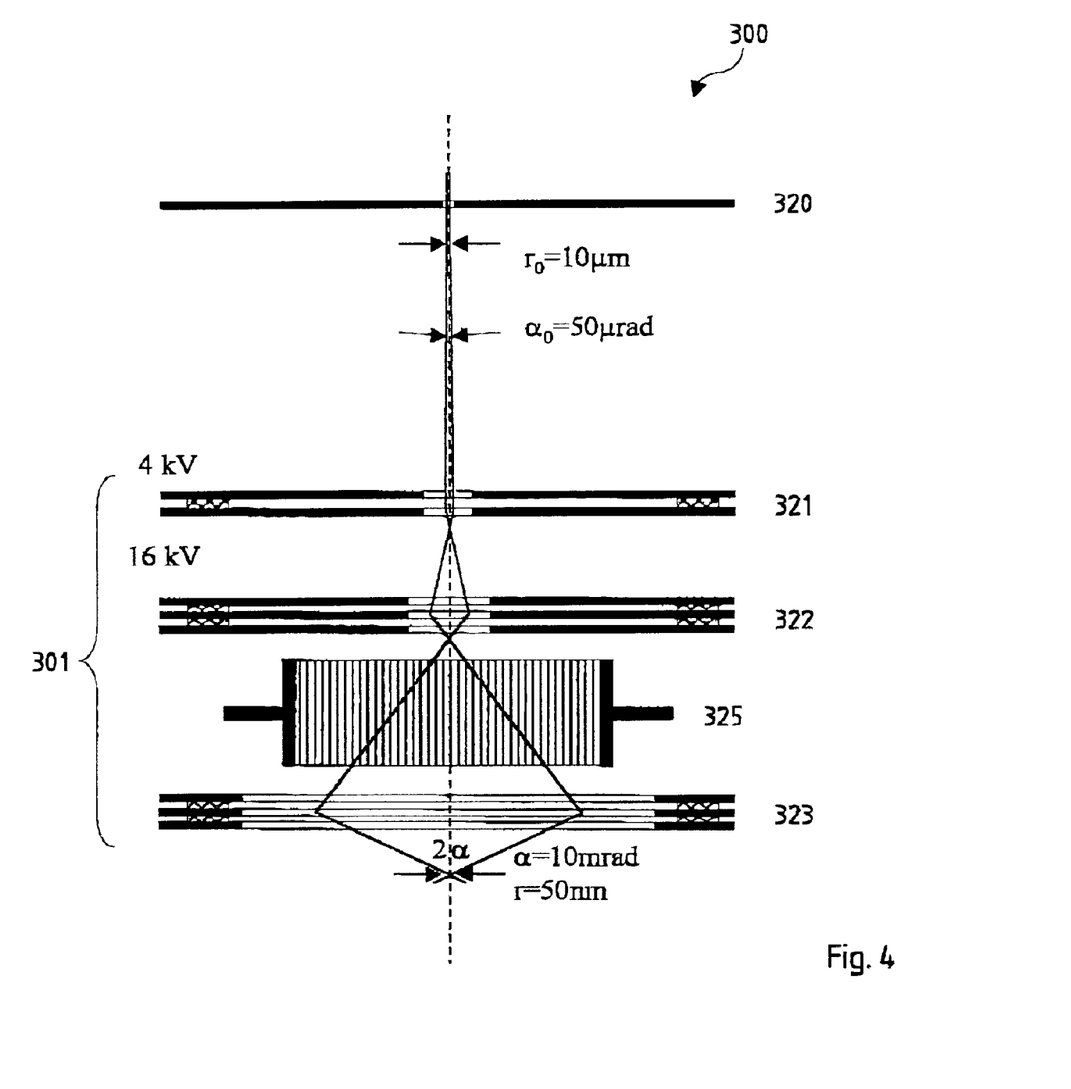
FIG. 4 a schematic longitudinal section of a single ion-optical microcolumn of the lithography system of FIG. 3.

An example for an ion-optical microcolumn suitable for the lithography setups of FIGS. 1 and 3 is shown schematically in FIG. 4. This three-stage ion-optical microcolumn 301 demagnifies a shaped sub-beam of protons delivered by the illumination system to the first aperture plate 320 according to the invention by a factor of 400 to the size needed for high-resolution direct writing. The energy of the incoming ions is 4 keV and the opening half angle is $\alpha_0=50\,\mu\text{rad}$. The first aperture plate 320 delimits the incoming sub-beam of 4 keV ions to a diameter of $2r_0=20\,\mu\text{m}$. Thus, a 400:1 demagnified image of the first aperture 320 is formed having a diameter of $2r=50$ nm on the substrate, with a sub-beam opening half angle of $\alpha=10$ mrad. The microcolumn 301 is designed for a sub-beam current of 1 nA, corresponding to a current density of the beam of about $0.3\,\text{mA/cm}^2$ at the first aperture plate. Each microcolumn has a lateral width of, e.g., less than 20 mm, in order to allow the above-mentioned mutual distance of 20 mm between neighboring sub-beams. It should be noted, however; that the applicant believe that the lateral dimension of the microcolumn can be reduced even below 10 mm. The entire lens system of the microcolumn 301 is realized as electrostatic lenses In order to achieve a sufficient brightness of the incoming ion beam required for high through-put lithography, in the present example the ion sub-beam has to be extracted from the plasma source through an exit aperture (anode opening) of approximately 20 μm diameter. Simulations of the trajectories (cf FIG. 5) indicate that a divergence half angle of approximately 0.1° can be expected for the beam exiting the extraction system, with a virtual source of 10 μm diameter situated at about the crossover position. In order to get an opening half angle of 50 μrad, the first aperture plate 206 has to be placed at least 10 cm downstream from the virtual source position. With an anode current density of 100 mA/cm$^2$, the desired 1 nA can be delivered to each aperture in the aperture plate 206 with all opening half angle of 50 μrad.

The demagnification is done in three steps in order to keep the total length of the column 301 as short as possible. As first step the beam is demagnified by a factor of 8 and accelerated by a factor of 4 by means of an immersion lens 321. Subsequently the beam is further demagnified in two steps by means of symmetric Einzel lenses 322,323 to the final radius of 25 nm. The focal length of the Einzel lenses will be about 5 mm to allow a working distance of at least 3 mm between the last electrode of the last lens and the wafer. The ion energy at the substrate is E=16 keV.

The quality of the final image is essentially determined by the quality of the image formed by the last Einzel lens 323. Both the spherical and chromatic aberrations of the preceding lenses 321,322 have a negligible influence due to the very small opening angles of the sub-beam in these lenses and because the changes in the image position caused by the chromatic aberration are only propagated very weakly (inversely proportional to the demagnification factor) to the succeeding stages. The same applies to global and stochastic space charge effects which are dominated by the final 50 nm cross-over.

For an estimation of the final image quality, it is clear from the above arguments that it is sufficient to account for the following effects: (i) the spherical aberration of the last lens, (ii) the chromatic aberration of the last lens, and (iii) the beam broadening by global and stochastic space charge effects within the beam during its travel from the last lens to the final image.

The spherical aberration coefficient $C_S$ for a decelerating three-aperture Einzel lens can be made as small as 10 by means of a suitable voltage ratio (see for example E. Harting and F. H. Read, "Electrostatic lenses", Elsevier North Holland, Amsterdam (Netherlands) 1976, p. 175). Thus the radius of the disc of least confusion $\Delta r_{sph}$ for the given opening half angle of α=10 mrad and a focal length of f=5 mm of the final lens will be $\Delta r_{sph}=0.25\alpha^3 C_S$ f=12.5 nm.

Assuming an energy width of the ion beam of ΔE=1 eV the axial smearing of the focal length due to chromatic aberration can be approximated by $\Delta f/f=\Delta E/2E=1/(2\times 16\cdot 10^3)=3\cdot 10^{-5}$, resulting in a defocusing $\Delta f=3\cdot 10^{-5}\times 5$ mm=150 nm. This yields an image broadening of $\Delta r=2\alpha\Delta f=2\times 10^{-2}\times 150$ nm, which is completely negligible with respect to the diameter of the writing bean, i.e., 50 nm. Concerning Coulomb interaction effects it has to be kept in mind that for protons the velocity for 16 keV is about $1.8\cdot 10^8$ cm/s. As the ion current is assumed to be 1 nA, equivalent to $6\cdot 10^9$ ions/s, the linear ion density is about 33 ions/cm resulting in an average distance of 300 μm, which is much larger than the sub-beam diameter. Thus already qualitatively, space charge effects can be expected to be very small. Quantitatively, the space charge broadening of the sub-beam can be estimated by simple electrostatic arguments described for example in "Focusing of charged particles", ed. A Septier, Academic Press, New York 1967, Vol. 2, Sect. 3.1, according to which the beam deflection due to space charge for the given current and energy is less than 1 per mile of the strength of the last Einzel lens, and therefore negligible. To summarize, a microcolumn 300 as shown in FIG. 4 can produce an aperture image as small as 50 nm, limited primarily by the spherical aberration $\Delta r_{sph}$ of the last lens.

The column 301 offers sufficient free space to add deflection elements 325. To optimize the overall performance of the column the deflector can be integrated into the last Einzel lens by using segmented electrodes, as discussed above with reference to FIG. 7, Choosing the lens openings such that its diameter is in the range of about 3 to 5 mm, it will be possible to write an image field of about 100×100 μm$^2$ without loss of image quality.

The time necessary to write one image point is determined by the resist sensitivity. Assuming a sensitivity of 1 μC/cm$^2$, the writing time per point will be about 25 ns, which is still much longer than the time of flight of the ion through a deflector of some mm length. Hence, for the described microcolumn using protons the necessary writing speed should be possible with simple deflection plates (FIG. 4) of this length.

The effective depth of focus will be about 0.25 μm determined by the opening half angle α=10 mrad of the beam at the final image and the condition that the image size should not change by more than 10%. In case of a significantly lower resist sensitivity or the use of ions having a smaller velocity, a dynamic deflection unit (travelling wave system as mentioned before) consisting of a sequence of multi-electrode deflectors may be implemented.

Of course, the substrate can be of any type and is not restricted to a wafer. In this context it is noteworthy that the invention also allows to structure substrate surfaces which have an overall surface rippling/curvature up to several μm with respect to a perfect plane layer. In particular, the position of the image plane can be determined individually for each sub-beam, and in-situ adjusted with respect to the actual wafer-to-column distance. Considering as an example, again, a 300 mm silicon wafer, it has to be dealt with a topography which is individual for each wafer. The fine adjustment with respect to the topography requires a repositioning of the final image along the axial direction of all sub-beams, which is done conveniently by adjusting the microcolumn optical system. Depending on the particular embodiment of the demagnification column, a small shift of the image plane in the μm range can be achieved easily by altering one or more voltage ratios of the respective demagnifying lenses. The height of a silicon wafer surface deviates from an ideal plane usually within a range of several μm over the area of the wafer. Since this rippling is smaller by a factor of about one thousand in comparison with the working distance between the substrate and the last lens of the microcolumn, namely a few mm, in the present example an individual change of the voltage ratio of the last electrostatic lens in the range of one per mille of the operating voltage is already sufficient. For the voltage conditions considered here a small variation of the voltage ratio leads to a relative change of the focus length of same order of magnitude (cf. E. Harting and F. H. Read, "Electrostatic lenses", op. cit.). It should be stressed that such deviations of the voltage ratios do generally not effect the spherical and chromatic aberration significantly, as neither $C_S$ nor f is altered significantly.

Figures 5, 5A:
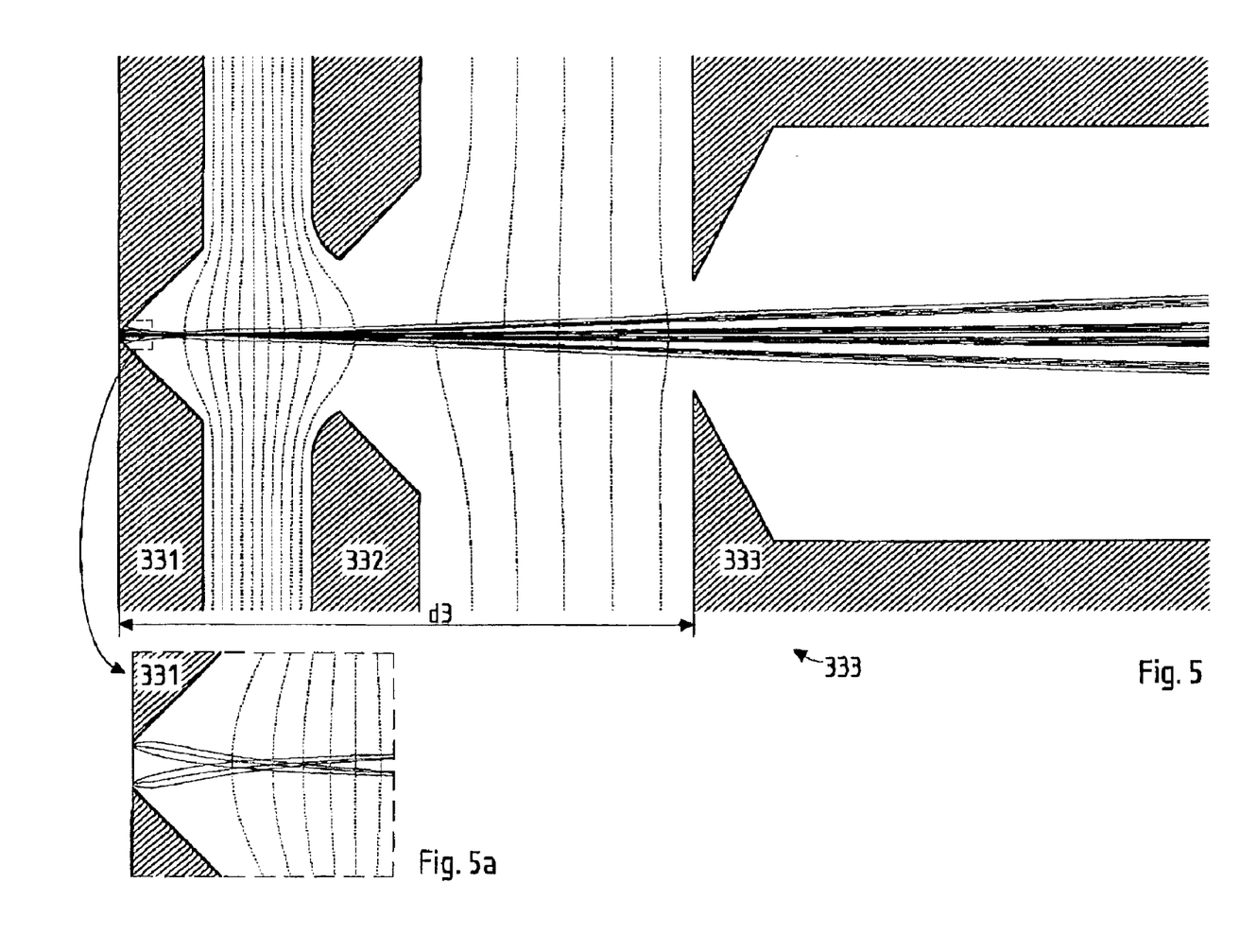
FIG. 5 a schematic longitudinal section of ail ion source extraction system showing some ion paths.
FIG. 5a a close-up view of FIG. 5 with a reduced number of ion paths, showing the virtual source size.

FIG. 5 shows a preferred extraction system 330 for one sub-beam in a diagrammatic longitudinal section; the arrangement has rotational symmetry around the optical axis (horizontal in FIG. 5). An appropriate number of extraction, systems of this type can also be used to realize the extraction array 202. The extraction system 330 comprises three electrodes 331,332,333, the first of which is the anode of the plasma chamber of the ion source (not shown in the figure), with a bore of 20 μm diameter. For 4 keV starting energy of the ions, the potential of this electrode 331 is, for instance, +4000 V. The second electrode 332 is at negative potential, e.g. at −2900 V, so that the field strength near the anode bore is high, that is, more than 100 kV/cm, and the refractive power of this extraction lens quickly focuses the ions to form a virtual source (cf FIG. 5a). The last electrode 333 is at 0V potential, defining the final energy of the extracted ions. The positive voltage with respect to the middle electrode 332 also prevents the secondary electrons emitted from the last electrode 333 to travel back into the ion source, The distance d3 between the anode bore and the aperture of the last electrode is 6 mm. After passing the electrode 333, the trajectories of the ions are substantially straight. The divergence of the sub-beam is defined by the angle between the trajectories of the outer rays of the sub-beam.

Figure 6:
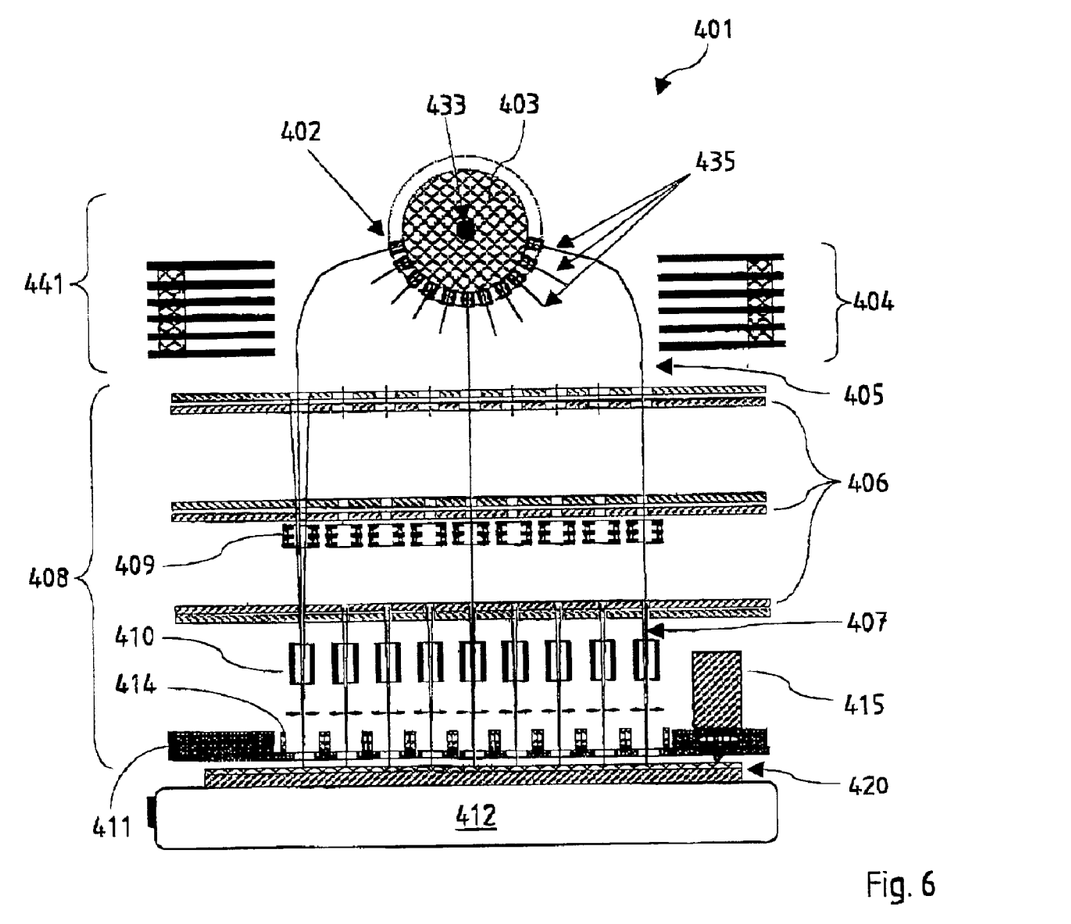
FIG. 6 a third multibeam lithography system, similar to the one in FIGS. 1 or 2, but with still a different illumination system.

The diameter of the virtual source is defined as the distance between the crossing points of trajectories of ions emitted from different positions at the maximum possible angle to the axis, positive and negative respectively. In FIG. 6, only for explanatory purposes, this angle is chosen to be 60°.

Yet another embodiment of the invention is depicted in FIG. 6 showing a lithography apparatus 401 having a spherical source 403 with a spherical anode plate An extraction array 402 forms sub-beams 435 having divergent beam axes immediately after tile anode bores. Each extraction unit of the extraction array 402 is realized, for instance, as a three-electrode system 330 as discussed above. The extraction electrodes of the extraction array 402 are arranged on spheres concentric to the anode plate, such that the virtual source 433 of all the sub-beams 435 is now located at the center of the spheres. In this case, the virtual source 433 is defined at the crossover of the backward projection of the trajectories leaving the extraction system. A collimator optics system 404 similar to the one of FIG. 1 produces a set of telecentric sub-beams 405. Thus, the spherical source 403, the extraction array 402 and the collimator system 404 constitute an illuminating system 441 for producing an illuminating beam 405 whose sub-beams illuminate the respective openings in the first of the aperture plates 406. The components 406–415, 420 of this embodiment correspond to those of the lithography system shown in FIG. 1 having reference numbers 106–115,120, respectively.

What is claimed is:

1. An apparatus for multibeam lithography by means of electrically charged particles, comprising an illumination system having a particle source, the illumination system producing an illuminating beam of said electrically charged particles, and a multibeam optical system positioned after the illumination system as seen in the direction of the beam, said multibeam optical system comprising at least one aperture plate having an array of a plurality of apertures to form a plurality of sub-beams, wherein the multibeam optical system focuses the sub-beams onto the surface of a substrate, for simultaneously writing a plurality of different patterns, wherein, for each sub-beam, a deflection unit is provided, said deflection unit being adapted to correct individual imaging aberrations of the respective sub-beam with respect to the desired target position and position the sub-beam during a writing process on the substrate surface, for independently writing a pattern which is different from patterns of other sub-beams, and wherein, for each sub-beam, the respective aperture of the first of the at least one aperture plate defines the size and shape of the sub-beam cross-section and the multibeam optical system produces an image of said aperture on the substrate surface.

2. The apparatus as claimed in claim 1, comprising a particle source and a collimator optical system for producing a particle beam which is substantially homogeneous across its cross-section and a multibeam optical system positioned after the collimator optical system as seen in the direction of the beam, said multibeam optical system forming the beam into a plurality of sub-beams and focusing the sub-beams onto the surface of a substrate, wherein the multibeam optical system comprises at least one aperture plate having an array of a corresponding plurality of apertures to form said sub-beams, wherein for each sub-beam a deflection unit is provided, said deflection unit being positioned after the multibeam optical system and adapted to correct individual imaging aberrations of the respective sub-beam with respect to the desired target position and/or position the sub-beam during a writing process an the substrate surface.

3. The apparatus as claimed in claim 1, wherein the electrically charged particles are ions.

4. The apparatus as claimed in claim 1, wherein for each sub-beam the respective aperture of the first aperture plate defines the size and shape of the sub-beam cross-section and the multi-beam optical system produces an image of said aperture on the substrate surface.

5. The apparatus as claimed in claim 4, wherein the multibeam optical system produces a demagnified image of sold aperture on the substrate surface, the demagnification factor being at least 20:1.

6. The apparatus as claimed in claim 5, wherein the demagnification factor is at least 400:1.

7. The apparatus as claimed in claim 1, wherein the multibeam optical system is realized as on electrostatic lens column array.

8. The apparatus as claimed in claim 1, wherein for each sub-beam an electrostatic lens arrangement is provided as a means to adjust the beam diameter at the substrate surface.

9. The apparatus as claimed in claim 8, wherein the electrostatic lens arrangement is placed within the multibeam optical system.

10. The apparatus as claimed in claim 1, wherein the deflection units are electrostatic multipole electrode systems.

11. The apparatus as claimed in claim 10, wherein the electrostatic multipole electrode systems are produced by means of microfabrication methods, e.g. using semiconductor technology.

12. The apparatus as claimed in claim 1, wherein the deflection units of the sub-beams are organized in groups, the controlling of the beam positioning of the sub-beams being performed synchronously for each group.

13. The apparatus as claimed in claim 1, comprising a reference plate for alignment of the particle optical system.

14. The apparatus as claimed in claim 13, comprising an optical alignment system to adjust the position of the substrate with respect to the reference plate.

15. The apparatus as claimed in claim 1, comprising several sequential aperture plates which are penetrated by the sub-beams, said aperture plates having openings forming aperture lenses having a focusing effect on the sub-beams.

16. The apparatus as claimed in claim 1, wherein the deflection unit is integrated into one or more of the electrodes forming the electrostatic lens arrangement.

17. The apparatus as claimed in claim 16, wherein the electrodes of the deflection unit are realized as sectors of at least one annular region around the apertures, the sectors being electrically insulated from each other.

18. The apparatus as claimed in claim 1, wherein the deflection unit is a traveling wave deflector means, comprising poles segmented in axial direction forming segments, the segments being connected in the axial direction by inductive and capacitive elements to transfer the electric field with the deflection unit from one segment to the next with a predetermined speed.

19. The apparatus of claim 1, wherein the deflection unit is positioned within the multibeam optical system.

20. A method for multibeam lithography by means of electrically charged particles, wherein a particle beam is produced by a particle source, transferred into an illuminating beam and formed into a plurality of sub-beams, the sub-beams being formed by means of at least one aperture plate having an array of a corresponding plurality of apertures and the sub-beam are focused onto the surface of a substrate, each image focused on the substrate surface being produced by a sub-beam whose size and shape is defined by a respective aperture in the aperture plate, wherein the beam position of each sub-beam is controlled by means of a deflection unit, for correcting individual imaging aberrations of the respective sub-beam with respect to the desired target position and positioning the sub-beam during a writing process on the substrate surface.

21. The method of claim 20, wherein each sub-beam is adjusted with respect to its beam diameter at the substrate surface by means of an electrostatic lens arrangement.

22. The method of claim 20, wherein the deflection units of the sub-beams are controlled in groups and the sub-beams are positioned synchronously for each group.

23. The method of claim 20, wherein the particle optical system is aligned using a reference plate.

24. The method as claimed in claim 20, wherein by means of an optical alignment system, the position of the substrate is adjusted with respect to the reference plate.

25. The method of claim 20, wherein the sub-beams penetrate several sequential aperture plates which are penetrated by the sub-beams, and are focused due to said aperture plates having openings forming aperture lenses.

26. The method of claim 20, wherein for each sub-beam the respective aperture of the first aperture plate defines the size and shape of the sub-beam cross-section and a multibeam optical system produces an image of said aperture on the substrate surface.

27. The method as claimed in claim 26, wherein the multibeam optical system produces a demagnified image of said aperture on the substrate surface, the demagnification factor being at least 20:1.

28. The method as claimed in claim 27, wherein the demagnification factor is at least 400:1.

29. The method of claim 20, wherein the focusing of the sub-beams onto the surface of a substrate is done by means of an electrostatic lens column array.

* * * * *